United States Patent
Kimura et al.

(10) Patent No.: US 6,197,391 B1
(45) Date of Patent: Mar. 6, 2001

(54) PYROLYTIC BORON NITRIDE CONTAINER AND MANUFACTURE THEREOF

(75) Inventors: Noboru Kimura; Takuma Kushihashi, both of Annaka; Kazuhiro Yamaguchi, Kanra; Akira Satoh, Annaka, all of (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 08/971,258

(22) Filed: Nov. 17, 1997

(30) Foreign Application Priority Data

Nov. 18, 1996 (JP) .................................................. 8-322280

(51) Int. Cl.[7] ................. B01L 3/04; B28B 1/30; B32B 7/02; C30B 11/00
(52) U.S. Cl. .............. 428/34.4; 428/34.6; 428/156; 428/170; 428/174; 428/212; 428/333; 428/337; 428/338; 428/446; 428/457; 428/698; 428/704; 427/255.28; 427/255.38; 427/590
(58) Field of Search .................. 428/34.4, 34.6, 428/688, 689, 332, 333, 337, 338, 340, 141, 600, 156, 170, 174, 212, 446, 457, 469, 698, 704, 255.28, 255.38, 590

(56) References Cited

U.S. PATENT DOCUMENTS

| | | | |
|---|---|---|---|
| 4,690,841 | * 9/1987 | Tanji et al. | 428/35 |
| 5,182,149 | * 1/1993 | Finicle | 428/34.6 |
| 5,588,995 | * 12/1996 | Sheldon | 117/201 |
| 5,674,317 | * 10/1997 | Kimura et al. | 117/208 |
| 5,827,371 | * 10/1998 | Colombo et al. | 118/726 |

FOREIGN PATENT DOCUMENTS 3-231459 10/1991 (JP) .
7-2617 1/1995 (JP) .

OTHER PUBLICATIONS

"Research Report", *Inorganic Material Research Laboratory*, No. 27, pp. 24–33

* cited by examiner

Primary Examiner—Ellis Robinson
Assistant Examiner—John J. Figueroa
(74) Attorney, Agent, or Firm—Oliff & Berridge, PLC

(57) ABSTRACT

There is disclosed a pyrolytic boron nitride container for accommodating a material serving as a source of molecular beams for molecular beam epitaxy, wherein the transmissivity of the pyrolytic boron nitride container with respect to light having a wave number of 2600 $cm^{-1}$ to 6500 $cm^{-1}$ has a profile such that the transmissivity changes in the height direction of the container. The pyrolytic boron nitride container can be manufactured through a simple process and at low cost. The pyrolytic boron nitride container can prevent material melt from rising along the inner wall surface and prevent splashed material melt from adhering to the upper portion of the container. Further, the pyrolytic boron nitride container can stabilize molecular beam epitaxial growth and improve the quality of epitaxial film.

20 Claims, 2 Drawing Sheets

EVACUATION

GAS

EVACUATION

GAS

PYROLYTIC BORON NITRIDE CONTAINER AND MANUFACTURE THEREOF

BACKGROUND OF THE INVENTION

1. Field of the Invention

The present invention relates to a pyrolytic boron nitride container. More particularly, the present invention relates to a pyrolytic boron nitride container suitable for retaining a material serving as a source of molecular beams used in molecular beam epitaxy (hereinafter abbreviated as "MBE").

2. Description of the Related Art

MBE is one method of manufacturing thin film, in which a thin-film growth chamber is maintained at ultra-low vacuum of $10^{-9}$–$10^{-11}$ Torr; a container that contains a material serving as a molecular beam source is heated to, for example, a temperature of 500–1600° C.; and molecular beams generated from the melt material are caused to impinge onto a heated substrate, so that a layer having a thickness corresponding to a few atoms is formed on the substrate in a controlled manner. Especially, the MBE method has been widely used for manufacture of epitaxial film of compound semiconductors such as GaAs, and from the viewpoints of purity, heat resistance, and strength, a pyrolytic boron nitride (PBN) container made through chemical vapor deposition (hereinafter abbreviated as "CVD") has been widely used as a container for accommodating a material serving as the molecular beam source.

Conventionally, when an operation according to such an MBE method is carried out for a prolonged period of time, material melt rises along the inner wall surface due to the capillary phenomenon and leaks out of the container, with the result that the material melt adheres to a heater, other heating members, and members inside a furnace, resulting in corrosion, degradation, and/or breakage of these components and members; and/or short-circuit of the heater. Especially, evaporated and scattered material melt is likely to adhere to the upper portion of the inner wall surface of the, container having a low temperature. With time, such material melt adhering to the upper portion of the container may rise along the inner wall of the container and leak out of the container or drop into the material melt to splash droplets of the material melt.

When the above-described phenomena occur, the lifetimes (or service-lives) of the above-described components and members decrease, resulting in an increase in cost and unstable operation. In addition, splashed droplets of the material melt may adhere to the substrate, resulting in formation of defects in the epitaxial film.

In order to solve the above-described problems, there has been proposed a pyrolytic boron nitride container in which carbon film having a high absorption coefficient with respect to infrared rays (IR) is applied to the outer or inner surface of the container in order to provide a radiant light absorbing layer (see Japanese Patent Application Laid-Open (kokai) No. 2-204391 and Japanese Utility Model Publication (kokoku) No. 7-2617). When the pyrolytic boron nitride container having the radiant light absorbing layer is heated by a heater, radiant light from the heater is absorbed by the absorbing layer, so that the container is heated efficiently and uniformly. Thus, the upper portion of the container is prevented from becoming excessively cool, so that adhesion of the material metal to the upper portion is suppressed.

Graphite and high-melting-point metal are generally considered to be suitable materials of the radiant light absorbing layer. However, these materials involves a fear that they may splash within the furnace and become mixed into epitaxial film, and a fear that since these materials are electrically conductive, if they come in contact with a heater disposed to surround the container, they may cause a short-circuit.

In order to solve this problem, there has been proposed a method to cover a graphite-made light absorbing layer with pyrolytic boron nitride (see Japanese Patent Application Laid-Open (kokai) Nos. 5-105557 and 4-231459). However, since this method involves a process of forming a composite layer of two different materials, manufacture of a pyrolytic boron nitride container involves much time and high cost. In addition, such a pyrolytic boron nitride container has a drawback that the composite layer tends to peel off during use.

SUMMARY OF THE INVENTION

The present invention has been conceived in view of the foregoing drawbacks. An object of the present invention is to provide a pyrolytic boron nitride container through a simple process and at low cost, which can prevent material melt from rising along the inner wall surface and prevent splashed material melt from adhering to the upper portion of the container when an operation is carried out for a prolonged period of time, which can be used in a stable manner, and which can stabilize molecular beam epitaxial growth and improve the quality of epitaxial film.

In order to achieve the above object, the present invention provides a pyrolytic boron nitride container for accommodating a material serving as a source of molecular beams for molecular beam epitaxy, wherein the transmissivity of the pyrolytic boron nitride container with respect to light having a wave number of 2600 $cm^{-1}$ to 6500 $cm^{-1}$ has a profile such that the transmissivity changes in the height direction of the container.

As a result of imparting such a profile to the IR transmissivity of the pyrolytic boron nitride used as a container for accommodating a material serving as a source of molecular beams for molecular beam epitaxy, the temperature distribution within the container can be controlled into a desired distribution. Accordingly, it is possible to effectively prevent rising of material melt along the inner wall surface and adhesion of material melt to the upper portion of the container.

Preferably, the profile of the transmissivity is set such that the transmissivity decreases stepwise or gradually from the bottom portion to the opening portion of the container. Alternatively, the profile of the transmissivity is preferably set such that the transmissivity increases stepwise or gradually from the bottom portion to the opening portion of the container.

As described above, as a result of imparting a profile to the IR transmissivity from the bottom portion to the opening portion of the container (in the height direction of the container), the temperature of the upper portion of the container is maintained high, so that adhesion of material melt to the upper portion and rising of the material melt thereto can be suppressed. Also, since the wettability with pyrolytic boron nitride varies with the kind of material melt, there is a case where the rising phenomenon can be suppressed through reduction of the temperature of the upper portion of the container. In such a case, the transmissivity of the container at the opening portion may be set high.

In the present invention, in order to impart a profile to the transmissivity of the pyrolytic boron nitride container with respect to light having a wave number of 2600 $cm^{-1}$ to 6500 cm$^{-1}$, the absorptivity of the pyrolytic boron nitride is preferably changed.

The present invention also provides a method of manufacturing a such a pyrolytic boron nitride container. In this method, pyrolytic boron nitride is deposited on a graphite mandrel by CVD in order to form a pyrolytic boron nitride container, and the pyrolytic boron nitride container is then separated from the mandrel, wherein the absorptivity of the deposited pyrolytic boron nitride produced by CVD is controlled through placement of the mandrel according to the pressure profile in a CVD furnace, such that the transmissivity of the pyrolytic boron nitride container with respect to light having a wave number of 2600 cm$^{-1}$ to 6500 cm$^{-1}$ varies in the height direction of the container.

As described above, if a desired profile is imparted to the transmissivity of the container through change of the physical properties of pyrolytic boron nitride, there can be solved the problem involved in the case where pyrolytic boron nitride is combined with other materials; i.e., contamination due to impurities and peeling off of composite film. In addition, a high-quality pyrolytic boron nitride container can be manufactured through use of a simple manufacturing process and at low cost.

Alternatively, the roughness of the outer surface of the pyrolytic boron nitride container may be changed in order to impart a profile to the transmissivity.

The present invention provides a method of manufacturing a pyrolytic boron nitride container whose transmissivity has the above-described profile. In this method, a profile is imparted to the roughness of the outer surface of the pyrolytic boron nitride container to thereby adjust the amount of light scattered at the surface of the container. Thus, a desired profile is imparted to the transmissivity of the container with respect to light having a wave number of 2600 cm$^{-1}$ to 6500 cm$^{-1}$.

As described above, the pyrolytic boron nitride container whose IR transmissivity has a profile can be manufactured by imparting a profile to the roughness of the outer surface of the container to thereby change the scattering amount of radiant light.

In this case as well, since the pyrolytic boron nitride container itself has an IR transmissivity profile, there can be solved the problem involved in the case where pyrolytic boron nitride is combined with other materials; i.e., contamination due to impurities and peeling off of composite film. In addition, high-quality pyrolytic boron nitride container can be manufactured through use of a simple manufacturing process and at low cost.

In the pyrolytic boron nitride container according to the present invention, a profile may be imparted to IR transmissivity through control of doping of elements into pyrolytic boron nitride, in which the thickness, area, or doping density of a doped layer is varied.

The present invention also provides a method of manufacturing a such a pyrolytic boron nitride container. In this method, pyrolytic boron nitride is deposited on a graphite mandrel by a CVD reaction in order to form a pyrolytic boron nitride container, and the pyrolytic boron nitride container is then separated from the mandrel, wherein a dopant gas is introduced into a furnace at least during the CVD reaction in order to form a doped layer in the pyrolytic boron nitride container, and the thickness, area, or doping density of a doped layer is adjusted in order to impart a desired profile to the transmissivity of the container with respect to light having a wave number of 2600 cm$^{-1}$ to 6500 cm$^{-1}$.

As described above, the pyrolytic boron nitride container whose IR transmissivity has a profile can also be manufactured through a doping process in which a dopant gas is introduced into a furnace during the CVD reaction in order to form a doped layer in the pyrolytic boron nitride container, and the doped layer is adjusted.

In this case as well, since a profile can be imparted to the IR transmissivity of the pyrolytic boron nitride container by changing the physical properties of the pyrolytic boron nitride container, there can be solved the problem involved in the case where pyrolytic boron nitride is combined with other materials; i.e., contamination due to impurities and peeling off of composite film. In addition, a high-quality pyrolytic boron nitride container can be manufactured through use of a simple manufacturing process and at low cost.

In this case, if the element is doped such that the doped layer does not exposed from the inner surface of the container, the material melt is not contaminated by the dopant.

The elements to be doped into pyrolytic boron nitride are one or more elements selected from B, N, Si, C, and Al. However, the dopant element usable in the present invention is not limited thereto.

The present invention also provides a pyrolytic boron nitride container for accommodating a material serving as a source of molecular beams for molecular beam epitaxy, wherein the reflectivity of the pyrolytic boron nitride container with respect to light having a wave number of 2600 cm$^{-1}$ to 6500 cm$^{-1}$ has a profile such that the reflectivity changes in the height direction of the container.

As a result of imparting such a profile to the IR reflectivity of the pyrolytic boron nitride used as a container for accommodating a material serving as a source of molecular beams for molecular beam epitaxy, the temperature distribution within the container can be controlled into a desired distribution. Accordingly, it is possible to effectively prevent rising of material melt along the inner wall surface and adhesion of material melt to the upper portion of the container.

Preferably, the IR reflectivity of the container is made equal to or less than 25% in the entire or partial outer surface of the container. In this case, the profile of the reflectivity may set such that the reflectivity decreases stepwise or gradually from the bottom portion to the opening portion of the container. Alternatively, the profile of the reflectively may be set such that the reflectivity increases stepwise or gradually from the bottom portion to the opening portion of the container.

As described above, the IR reflectivity of the container is made equal to or less than 25% in the entire or partial outer surface of the container to thereby impart a profile to the IR reflectivity from the bottom portion to the opening portion of the container (in the height direction of the container). Therefore, the temperature of the upper portion of the container is maintained high, so that adhesion of material melt to the upper portion and rising of the material melt thereto can be suppressed. Also, since the wettability with pyrolytic boron nitride varies with the kind of material melt, there is a case where the rising phenomenon can be suppressed through reduction of the temperature of the upper portion of the container. In such a case, the reflectivity of the container at the opening portion may be set large.

In the pyrolytic boron nitride container according to the present invention, the above-described profile may be imparted to IR transmissivity through control of doping of elements into pyrolytic boron nitride, in which the thickness, area, or doping density of the doped layer is varied.

The present invention also provides a method of manufacturing a such a pyrolytic boron nitride container. In this method, pyrolytic boron nitride is deposited on a graphite mandrel by a CVD reaction in order to form a pyrolytic boron nitride container, and the pyrolytic boron nitride container is then separated from the mandrel, wherein a dopant gas is introduced into a furnace at least during the CVD reaction in order to form a doped layer in the pyrolytic boron nitride container, and the thickness, area, or doping density of the doped layer is adjusted in order to impart a desired profile to the transmissivity of the container with respect to light having a wave number of 2600 $cm^{-1}$ to 6500 $cm^{-1}$.

As described above, the pyrolytic boron nitride container whose IR transmissivity has a profile can also be manufactured through a doping process in which a dopant gas is introduced into the furnace during the CVD reaction in order to form a doped layer in the pyrolytic boron nitride container, and the doped layer is adjusted.

In this case as well, since a profile can be imparted to the IR reflectivity of the pyrolytic boron nitride container by changing the physical properties of the pyrolytic boron nitride container, there can be solved the problem involved in the case where pyrolytic boron nitride is combined with other materials; i.e., contamination due to impurities and peeling off of composite film. In addition, a high-quality pyrolytic boron nitride container can be manufactured through use of a simple manufacturing process and at low cost.

DESCRIPTION OF THE INVENTION AND PREFERRED EMBODIMENTS

Figure 1A:
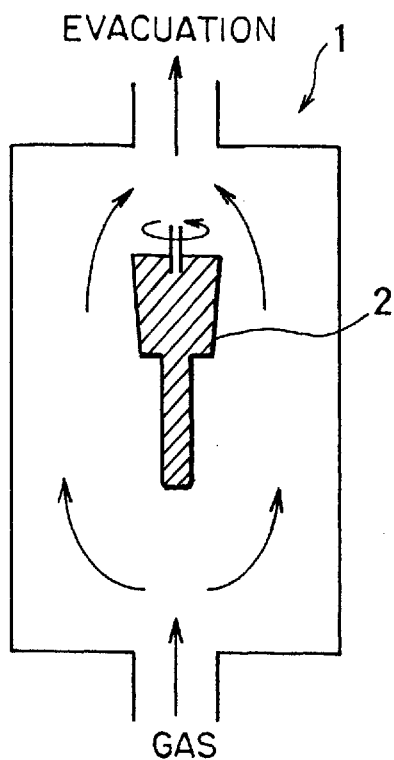
FIG. 1A is an schematic cross-sectional view illustrating the manufacture of a pyrolytic boron nitride container used in an MBE method through CVD, in which a graphite mandrel is positioned such that the bottom portion of the container is directed to a source gas supply port.

The present invention and its embodiments will be described in detail hereinbelow, but the present invention is not limited to the embodiments.

The inventors of the present invention have performed studies in order to suppress rising of material melt and adhesion of the material melt to the upper portion of the container in the MBE method. As a result, the inventors have found that these phenomena can be suppressed effectively by imparting a profile to the radiant-light transmissivity or reflectivity of the pyrolytic boron nitride container itself. The present invention was accomplished based on this finding. Specifically, by imparting a profile to the radiant-light transmissivity or reflectivity of the pyrolytic boron nitride container in the height direction thereof, a temperature distribution is produced in such a manner, for example, that the temperature of the bottom portion becomes low and the temperature of the opening portion opposite the bottom portion becomes high. This enables epitaxial film to be grown by the MBE method in an ideal temperature environment.

If a profile is imparted to the IR transmissivity or reflectivity of the pyrolytic boron nitride container itself, there can be solved the problem involved in the above-described case where composite film is coated on pyrolytic boron nitride to obtain a PBN container; i.e., contamination due to impurities, short circuit of a heater, and peeling off of the composite film. In addition, the pyrolytic boron nitride container can be manufactured through use of a simple manufacturing process and at low cost.

First, the inventors performed studies on the wave number of radiant light to be passed through or be reflected by a container used for the MBE method. According to the MBE method, the temperature used for generating beams ranges from about 500 to 1600° C., and more practically, 800 to 1600° C. The maximum energy-transfer wavelength λ max at this time is represented by Expression (1):

$$\lambda\ max=2{,}898\ (\mu m \cdot K)/T, \qquad (1)$$

where T is the temperatures in degrees Kelvin.

When λ max is calculated from Expression (1) with regard to the above-described temperature range, the λ max varies in the range of 3750 nm to 1550 nm, and more practically in the range of 2700 nm to 1550 nm. When these values are converted into wave numbers, there are obtained a general wave-number range of 2600 $cm^{-1}$ to 6500 $cm^{-1}$, and a more practical wave-number range of 3700 $cm^{-1}$ to 6500 $cm^{-1}$. Consequently, by imparting a profile to the transmissivity or reflectivity with respect to light ranging from 2600 $cm^{-1}$ to 6500 $cm^{-1}$, it becomes possible to control the temperature profile in the material melt and at various portions of the container.

For example, if a resistance-heating type heating unit, such as a tantalum heater, arranged around a container is employed as a heat source, heat is supplied to material melt from the outside of the container in the form of radiant heat. If radiant heat is not absorbed by pyrolytic boron nitride that constitutes the container and passes therethrough, only the bottom portion of the container where material melt exists is heated, and the temperature of the upper portion of the container decreases. When the transmissivity of the pyrolytic boron nitride container with respect to light having a wave number of 2600 $cm^{-1}$ to 6500 $cm^{-1}$ is imparted with a profile such that the transmissivity gradually or stepwise decreases from the bottom portion to the opposite opening portion, the opening portion of the container can be efficiently and selectively heated. As result, the temperature of the upper portion of the container can be maintained high in order to prevent the material melt from adhering to the upper portion.

Since each of pyrolytic boron nitride and pyrolytic graphite has a high reflectivity of 30 to 70% with respect to light having a wave number of 2600 $cm^{-1}$ to 6500 $cm^{-1}$, most portion of radiant light is not absorbed by the wall of the container that contains a molecular beam source and reflected, so that only the bottom portion of the container where material melt exists is heated and the temperature of the upper portion of the container decreases. However, when the reflectivity of the pyrolytic boron nitride container with respect to light having a wave number of 2600 cm$^{-1}$ to 6500 cm$^{-1}$ is imparted with a profile such that the reflectivity gradually or stepwise decreases from the bottom portion to the opposite opening portion and thus the reflectivity becomes equal to or less than 25% in the entire or partial surface, the opening portion of the container can be efficiently and selectively heated. As a result, the temperature of the upper portion of the container can be maintained high in order to prevent the material melt from adhering to the upper portion.

The desired temperature distribution to be produced in the pyrolytic boron nitride container used in the MBE method is such that the temperature of the upper portion is maintained high in order to prevent material melt from adhering to the upper portion of the container. However, in some cases, the phenomenon in which the material melt rises along the inner wall of the container cannot be suppressed through reduction of the temperature of the upper portion of the container.

It is considered that the above described case occurs because the wettability with pyrolytic boron nitride varies with the kind of material melt. Such a case can be coped with by imparting a profile to the IR transmissivity such that the IR transmissivity stepwise or gradually increases from the bottom portion to the opening portion of the container, or by changing the transmissivity or the reflectivity in an area at a predetermined height.

The inventors have developed three methods for imparting a profile to the transmissivity of the pyrolytic boron nitride container itself used in the MBE method such that the transmissivity respect to light having a wave number of 2600 cm$^{-1}$ to 6500 cm$^{-1}$ varies in the height direction; namely, (1) a method of changing the optical absorptivity by changing the density of pyrolytic boron nitride (PBN); (2) a method of changing the degree of scattering of light by changing the roughness of the outer surface of the PBN; and (3) a method of doping elements into the PBN while changing the thickness, area, doping density of the doped layer. These methods can also be applied to the method in which a profile is imparted to the reflectivity of the container.

These methods will be described in more detail while mainly referring to an exemplary case where the IR transmissivity or reflectance of a container at the upper portion (opening portion) thereof is decreased in order to increase the temperature of the upper portion of the container.

(1) Method of Changing the Optical Absorptivity of Pyrolytic Boron Nitride

With regard to optical characteristics, boron nitride (BN) has a bandgap (Eg) of 5.8 eV (see "Research Report," Inorganic Material Research Laboratory, No. 27, pg. 26). Boron nitride has an IR absorption at wave numbers 1380 cm$^{-1}$ and 810 cm$^{-1}$ (see D. N. Bose, H. K. Henisch, J. Am. Cer. Soc. 53, pg. 281 (1970)). Accordingly, boron nitride should be transparent with respect to light having a wave number of 2600 cm$^{-1}$ to 6500 cm$^{-1}$. However, pyrolytic boron nitride (PBN) has crystallographic irregularities, and turbostatic crystals or the like are mixed in pyrolytic boron nitride. For these reasons, in practice there is a certain degree of absorption of light even at the foregoing wave number.

Conventional PBN used in the MBE method has a high degree of orientation and a density of 2.1 to 2.2, which is close to a theoretical density of 2.25. PBN having such a high degree of orientation has an absorptivity of about 2.0 with respect to light having a wave number of 2600 cm$^{-1}$ to 6500 cm$^{-1}$. Accordingly, in the present invention, it is desired that the absorptivity of the container at the opening portion be increased as much as possible in order to permit more effective absorption of radiant heat at that area, while the absorptivity at the bottom portion be decreased as much as possible, preferably to 1.7 or less.

Further, in order to produce a difference in absorptivity between the bottom portion and the opening portion of the container, thereby permitting transmission of radiant heat through the bottom portion of the container and absorption of radiant heat in the opening portion of the container in order to make the temperature of the upper portion of the container sufficiently high, the difference in absorptivity between the bottom portion and the opening portion of the container is set to 0.5 or more, preferably 1.0 or more.

An explanation is given of a method of manufacturing a pyrolytic boron nitride container of the present invention which has a low absorptivity at its bottom portion but has a high absorptivity at its opening portion.

Generally, a PBN container is manufactured by a process in which pyrolytic boron nitride is deposited on a graphite mandrel by CVD in order to form a PBN container, and the PBN container is separated from the mandrel.

For example, a PBN container can be manufactured through use of boron halide and ammonium as source gases. pyrolytic boron nitride is deposited on the graphite mandrel having a desired shape through CVD at a high temperature ranging from 1600–2000° C. under a pressure of 10 Torr or less, so that a PBN container having a required thickness is formed on the mandrel. Subsequently, the PBN container is cooled to room temperature, and the graphite mandrel is removed. Subsequently, the PBN container is machined into a final shape.

As a result of experimental studies performed by the inventors, it has been found that the transmissivity and absorptivity of pyrolytic boron nitride with respect to light having a wave number of 2600 cm$^{-1}$ to 6500 cm$^{-1}$ depend on the conditions for the CVD of pyrolytic boron nitride, particularly on pressures.

More specifically, it has been found that if the CVD of pyrolytic boron nitride is carried out under a comparatively high pressure, the density of deposited pyrolytic boron nitride tends to be comparatively low. As a result, the transmissivity of pyrolytic boron nitride becomes comparatively high, whereas the absorptivity of the same becomes comparatively low. In contrast, if the CVD of pyrolytic boron nitride is carried out under a comparatively low pressure, there is a tendency opposite to the previously-described tendency.

Although the details of the phenomena are theoretically unknown, if the CVD of pyrolytic boron nitride is carried out under a comparatively high pressure, the density of pyrolytic boron nitride tends to be comparatively low. Therefore, it is considered that the thus-deposited pyrolytic boron nitride is partially vitrified, as a result of which the transparency of the pyrolytic boron nitride with respect to light having a wave number of 2600 cm$^{-1}$ to 6500 cm$^{-1}$ increases.

Utilization of the above-described phenomena makes it possible to decrease the absorptivity of the container at the bottom portion and increase the absorptivity at the opening portion, thereby producing a difference in absorptivity between the bottom portion and the opening portion of the container.

As previously described, since the PBN container is manufactured by CVD under a reduced pressure, the manufacture of the PBN container is carried out by supplying source gases to a CVD furnace while the CVD is evacuated by a pump. Accordingly, there arises a pressure profile in the CVD furnace wherein the pressure becomes high on the source gas supply side and becomes low on the evacuation side. If pyrolytic boron nitride is chemically deposited on the graphite mandrel which is positioned in such a way that the bottom portion of the PBN container is placed in a high-pressure area, or in the vicinity of a port for supplying source gases, and the opening portion of the PBN container is placed in a low-pressure area, or in the vicinity of an evacuation port, a resultantly-produced PBN container has low absorptivity at its bottom portion but high absorptivity at its opening portion.

Particularly, when it is desired to increase the difference in absorptivity and transmissivity between the bottom portion and the opening portion of the pyrolytic boron nitride container, the difference can be increased by increasing the pressure difference between a location where the bottom portion of the container is positioned and a location where the opening portion of the same is positioned. Therefore, in this case, it is necessary to make the gradient of a pressure profile steep by increasing the pressure loss in the CVD furnace. The gradient of the pressure profile can be easily made steep by a commonly-practiced method such as a method in which a pressure loss is forcibly produced by control of the amount of supplied source gases, by adjusting the evacuating capacity of the pump, by changing the shape of the CVD furnace, or by providing a baffle plate in the CVD furnace.

(2) Method of Changing the Degree of Scattering of Light by Changing the Roughness of the External Surface of PBN Container A profile can be also imparted to the transmissivity and absorptivity of the PBN container with respect to light having a wave number of 2600 $cm^{-1}$ to 6500 $cm^{-1}$ by controlling the state of the surface of pyrolytic boron nitride, or the surface roughness of pyrolytic boron nitride.

For example, Table 1 shows the results of studies on the relationship between the surface roughness of pyrolytic boron nitride and the transmissivity and absorptivity at a wave number ranging from 2600 $cm^{-1}$ to 6500 $cm^{-1}$.

TABLE 1

| Surface finishing | Absorptivity | Thickness (mm) | Apparent transmissivity (%) | Apparent absorptivity (/mm) |
| --- | --- | --- | --- | --- |
| As-depo | | 0.40 | 30 | 1.3 |
| #320 | 1.2 | 0.40 | 7.6 | 2.8 |
| #1200 | | 0.40 | 19 | 1.8 |
| As-depo | | 0.20 | 32 | 2.5 |
| #320 | 2.2 | 0.20 | 9.3 | 5.2 |
| #1200 | | 0.20 | 23 | 3.2 |

The results show differences in apparent optical transmissivity and absorptivity among (1) pyrolytic boron nitride having an absorptivity of 1.2 was left as is after having been deposited by CVD (As-depo); (2) pyrolytic boron nitride having an absorptivity of 1.2 was sanded with coarse #320 $Al_2O_3$ paper; (3) pyrolytic boron nitride having an absorptivity of 1.2 was sanded with fine #1200 $Al_2O_3$ paper; (4) pyrolytic boron nitride having an absorptivity of 2.2 was left as is after having been deposited by means of CVD; (5) pyrolytic boron nitride having an absorptivity of 2.2 was sanded with coarse #320 $Al_2O_3$ paper; (6) and pyrolytic boron nitride having an absorptivity of 2.2 was sanded with fine #1200 $Al_2O_3$ paper.

As is evident from Table 1, in the case of As-depo, there is a small difference between the inherent absorptivity and the apparent absorptivity, and therefore it is considered that there is a relatively low degree of scattering of light from the surface of the pyrolytic boron nitride. In contrast, in the case of pyrolytic boron nitride sanded with #320 paper, the surface of pyrolytic boron nitride is coarse, which in turn results in a high degree of scattering of light. Therefore, the apparent absorptivity of pyrolytic boron nitride becomes considerably high, whilst the transmissivity of the same becomes low. In the case of pyrolytic boron nitride sanded with #1200 paper, the surface of pyrolytic boron nitride becomes finer than that of the pyrolytic boron nitride sanded with the #320 paper. Therefore, the degree of scattering of light is decreased, and the apparent absorptivity of pyrolytic boron nitride is also reduced, thereby resulting in an increase in transmissivity of pyrolytic boron nitride.

As described above, the transmissivity of pyrolytic boron nitride can be changed by controlling its surface roughness. Therefore, for example, the outer surface of the pyrolytic boron nitride container is sanded with #320 paper at its opening portion, and is left as is at the bottom portion. The portion of the outer surface between the opening portion and the bottom portion is sanded with #1200 paper. In this case, the PBN container has a coarse outer surface in its opening portion but a fine outer surface in its bottom portion, so that the transmissivity of the PBN container decreases gradually or stepwise from the bottom portion to the opening portion of the PBN container.

(3) Method of Doping Elements into PBN

When pyrolytic boron nitride is deposited by CVD, a dopant gas is introduced in order to dope desired elements into PBN. This method makes it possible to impart a profile to the transmissivity or reflectivity of the PBN container simply and reliably.

In this case, any kind of element may be doped, insofar as the element can change the IR transmissivity or reflectivity of PBN. However, in terms of easiness of doping process, one or more elements selected from B, N, Si, C, and Al are used.

When a gas containing a dopant element such as $BF_3$, $N_2H_4$, $SiCl_4$, $CH_4$, or $Al(CH_3)_3$ is introduced as a dopant gas during the deposition of PBN on the mandrel through CVD, the dopant element is doped in the PBN, so that a doped layer is formed.

The doped layer can be formed at any location on the PBN container. For example, such a doped layer may be formed on the inner surface of the container. However, if the doped layer is formed on the inner surface, the doped layer is likely to contaminate material melt accommodated in the container. Therefore, the doped layer is preferably formed such that it is not exposed from the inner surface. Therefore, when the doped layer is formed on the outer surface of the container or within the wall of the container, there is no fear that the material melt is contaminated by these elements.

Through adjustment of the thickness, area, or doping density of the doped layer, a profile of the transmissivity or reflectivity of the PBN container with respect to light having a wave number of 2600 $cm^{-1}$ to 6500 $cm^{-1}$ can be freely controlled.

For example, when the doping is performed such that the thickness of the doped layer, the doping density, or the doping area is increased at the opening portion of the PBN container, and the thickness of the doped layer or the doping area is decreased or the doped layer is prevented from being formed at the bottom portion of the PBN container, the transmissivity or reflectivity can be changed stepwise or gradually from the bottom portion to the opening portion of the container.

The thickness of the doped layer can be controlled through adjustment of the time over which the dopant gas is introduced during the CVD reaction. The doping density can be controlled through adjustment of the density of a dopant contained in the gas to be introduced. A profile can be imparted to the thickness of the doped layer or the doping area through a simple operation such as mechanical abrasion of the doped layer after completion of the doping reaction.

EXAMPLES

Example 1 and Comparative Example 1

Figure 1B:
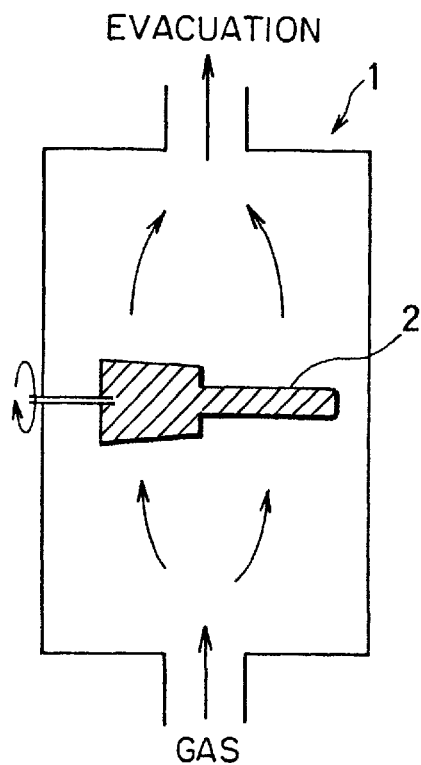
FIG. 1B is a schematic cross-sectional view similar to FIG. 1A, wherein the graphite mandrel is positioned such that the side of the container is directed to the source gas supply port.

In Example 1, in order to increase the density of pyrolytic boron nitride at the opening portion of a container used in the MBE method, a graphite mandrel was disposed in a cylindrical graphite CVD furnace in such a way that the opening portion of the container is positioned in a low-pressure region, and the bottom portion of the container is positioned in the vicinity of a source gas supply port (FIG. 1A). In Comparative Example 1, in order to obtain a container having a uniform density distribution throughout the container, the mandrel was disposed in such a way that the side of the container was positioned in the vicinity of the source gas supply port (FIG. 1B). Pyrolytic boron nitride was deposited on the mandrel while rotating the thus-disposed mandrel.

Boron trichloride and ammonium were supplied to the furnace at 2 l/min. and 5 l/min., respectively, and reacted at a temperature of 1850° C. under a mean pressure of 2 Torr at the center of the furnace, whereby a PBN container having a flange at the opening portion thereof and having a thickness of 0.8 to 1.3 mm, a diameter of 20 mm, and a height of 150 mm was manufactured. At this time, the pressure in the area around the source gas supply port within the CVD furnace was about 4 Torr, and the pressure in the area around an evacuation portion was about 2 Torr. After the reaction, the PBN container was separated from the mandrel. The PBN container was then machined, so that a PBN container having a desired final shape was manufactured.

The light absorption amount A in the range of 2600 $cm^{-1}$ to 6500 $cm^{-1}$ was measured at the bottom portion, the center portion and the opening portion of the PBN container through use of an IR spectrometer (FTIR-710, product of NICOLET Corp.). For the bottom portion, the center portion, and the opening portion, absorptivity B with respect to light at a wave number of 4800 $cm^{-1}$ was obtained from Equations (2), (3), and (4) provided below. Table 2 shows the results of the calculation.

$$\text{Light absorption amount } A = \text{Log}_{10}(I_0/I), \quad (2)$$

where $I_0$ is the intensity of incident light, and I is the intensity of transmitted light;

$$\text{Absorptivity } B = A/t, \quad (3)$$

where t is a thickness of pyrolytic boron nitride; and $$\text{Transmissivity } (T) = I/I_0. \quad (4)$$

TABLE 2

| PBN container | Absorptivity | | |
| --- | --- | --- | --- |
| | Bottom portion | Center portion | Opening portion |
| Example 1 | 0.9 | 1.5 | 2.2 |
| Comparative Example 1 | 1.7 | 1.6 | 1.6 |

As is evident from the results shown in Table 2, the absorptivity of the bottom portion of the container of Example 1 is low, whereas the absorptivity of the opening portion of the container is high. If this container is used for the MBE method, it is expected that due to absorption of radiant light at the opening portion, the temperature of the upper portion of the container is prevented from decreasing, so that adhesion of material melt to the upper portion and rising of the material melt are effectively suppressed. In contrast, the overall container of Comparative example 1 has a constant absorptivity, and hence the temperature of the upper portion of the container where no material melt exists decreases, so that the phenomena of adhesion of the material melt to the upper portion and rising of the material melt become remarkable.

Example 2

Next, a PBN container which as a whole has uniform absorptivity and transmissivity was formed in the same manner as was Comparative Example 1. In this case, a mean pressure in the furnace was set to 4 Torr so as to reduce the absorptivity of the overall container. The absorptivity and transmissivity of each portion of the thus-formed PBN container with respect to light at a wave number of 4800 $cm^{-1}$ were previously measured.

Figure 2:
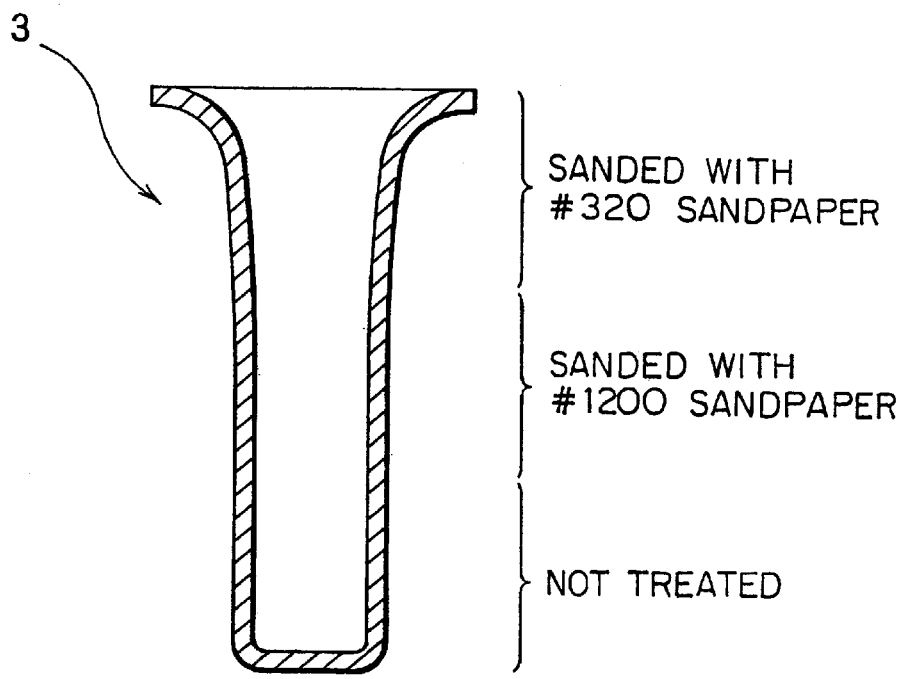
FIG. 2 is a schematic cross-sectional view of a pyrolytic boron nitride container, wherein the opening portion of the container is sanded with #320 alumina sandpaper, and the center of the container measuring about 5 cm is sanded with #1200 alumina sandpaper while the bottom portion of the container is left as is after having been deposited.

As illustrated in FIG. 2, the opening portion of the PBN container was sanded with #320 alumina sandpaper, and the center of the PBN container which measures about 5 cm was sanded with #1200 alumina sandpaper. The bottom portion of the PBN container was left as is after having been deposited. The transmissivity of each of portion of the thus-sanded PBN container with respect to light of 4800 $cm^{-1}$ was measured again. Table 3 shows the results of the measurement.

TABLE 3

| | Bottom portion | Center Portion | Opening Portion |
| --- | --- | --- | --- |
| Absorptivity | 0.8 | 1.0 | 0.9 |
| Transmissivity (%) | 14 | 9 | 11 |
| Post-treatment transmissivity (%) | 14 | 6 | 3 |

As is evident from the results shown in Table 3, in the surface-treated PBN container of Example 2, light scatters from the roughly-sanded surface of the opening portion, and hence the transmissivity has become low. In contrast, since the bottom portion of the pyrolytic boron nitride is left as is after having been deposited, it has a high optical transmissivity. If this PBN container is used for the MBE method, the opening portion of the container is less likely to permit transmission of radiant heat. As a result, it is expected that an ideal temperature gradient will be produced within the container, so that adhesion and rising of material melt at the upper portion of the container can be prevented effectively.

Example 3

Next, a PBN container which as a whole has uniform absorptivity and transmissivity was formed in the same manner as was Comparative Example 1. In this case, a mean pressure in the furnace was set to 4 Torr so as to reduce the absorptivity of the overall container. The absorptivity and transmissivity of each portion of the thus-formed PBN container with respect to light at a wave number of 4800 $cm^{-1}$ were previously measured.

Figure 3:
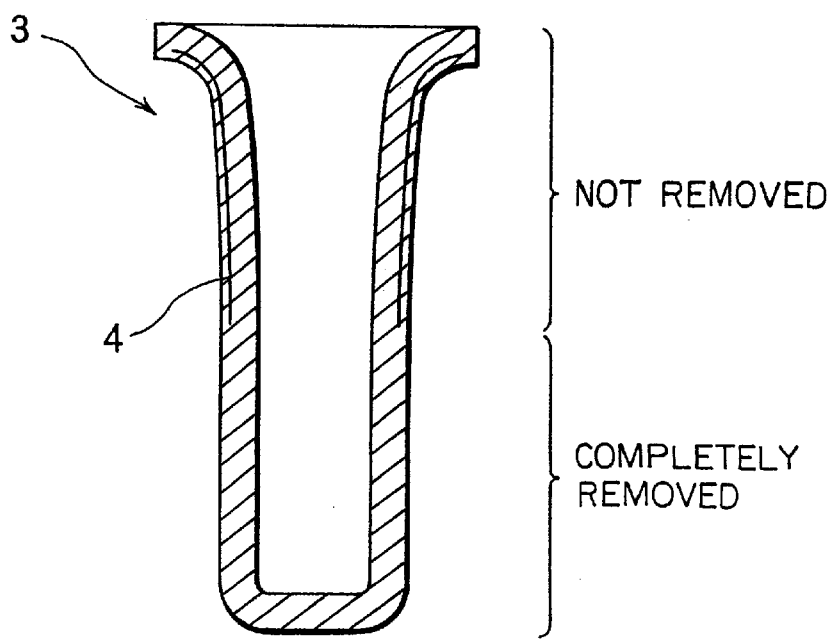
FIG. 3 is a schematic cross-sectional view of a pyrolytic boron nitride container doped with carbon.

The thus-formed PBN container was set in the CVD furnace again, and the temperature of the CVD furnace was increased to 1600° C. under a reduced pressure of 1 Torr. Subsequently, methane gas, boron trichloride, and ammonium were supplied to the furnace at 5 SLM, 2 l/min. and 5 l/min., respectively, so that a carbon-doped layer was formed over the surface of the PBN container. The carbon-doped PBN container was taken out of the furnace after having been cooled. As illustrated in FIG. 3, the carbon-doped layer was removed by mechanical abrasion from a substantially half of the surface at the bottom portion, whereas the carbon-doped layer was left as is at the opening portion of the container. The surface-treated pyrolytic boron nitride container was set in the CVD furnace again, and a pyrolytic boron nitride layer was deposited to a thickness of about 100 μm on the outermost surface of the PBN container. As a result, the carbon-doped layer was embedded in the pyrolytic boron nitride coating.

The transmissivity of the PBN container having carbon-doped layer with respect to light of 4,800 $cm^{-1}$ was measured again. Table 4 shows the results of the measurement.

TABLE 4

|  | Bottom portion | Opening portion |
|---|---|---|
| Absorptivity | 0.9 | 0.9 |
| Transmissivity (%) | 8.3 | 8.3 |
| Post-doping transmissivity (%) | 6.8 | 0.03 |

As is evident from the results shown in Table 4, in the PBN container of Example 3 in which pyrolytic boron nitride is doped with carbon, carbon elements absorb light at the opening portion. As a result, the transmissivity of the opening portion of the PBN container becomes very low. In contrast, the bottom portion of the PBN container does not has a doped layer, and pyrolytic boron nitride is left as is after having been deposited. Therefore, the bottom portion has high optical transmissivity. If the PBN container is used for the MBE method, a larger amount of radiant light is absorbed by the opening portion, and thus the temperature of the upper portion of the container is prevented from decreasing. As a result, it is expected that adhesion and rising of material melt at the upper portion is effectively suppressed.

In the present example, for the purpose of measurement of transmissivity or the like, the CVD reaction was interrupted to take out a formed container, and then a doped layer was formed thereon. However, in general, the CVD reaction is continuously effected, and a dopant gas is introduced at a desired timing.

Comparative Example 2

A PBN container was formed in the same manner as was Comparative Example 1. Subsequently, the container was placed in the CVD furnace, and the temperature was increased to 1750° C. under a reduced pressure of 1 Torr. Methane gas was then supplied to the furnace at 5 SLM to form a carbon layer having a thickness of 50 μm over the surface of the PBN container. The thus-coated PBN container was taken out of the furnace after having been cooled. The carbon layer was removed by mechanical abrasion from the inner surface and the outer surface of the bottom portion. Further, the surface-treated pyrolytic boron nitride container was set in the CVD furnace again, and a pyrolytic boron nitride layer was deposited to a thickness of about 100 μm on the outermost surface of the PBN container. As a result, the carbon layer was embedded in the pyrolytic boron nitride coating.

However, the thus-manufactured container was unusable because the layer composited after cooling peeled off and the container was broken.

Subsequently, GaAlAs epitaxial film was actually grown by the MBE method through use of each of the PBN containers manufactured in the previous Examples 1 through 3 and Comparative example 1.

The growth of the epitaxial film was performed under a reduced pressure of $10^{-10}$ Torr at a heating temperature of 1000° C. while a PBN container was used as a container for accommodating Ga.

The surface of the grown epitaxial film was observed through use of an optical microscope, and the density of surface defects was measured. The results of the measurement are shown in Table 5.

TABLE 5

| Used PBN crucible | Density of surface defects (number of defects/cm²) |
|---|---|
| Example 1 | 10 |
| Example 2 | 15 |
| Example 3 | 5 |
| Comparative Example 1 | 912 |
| Comparative Example 2 | Broken (no data) |

As is evident from Table 5, in a case where the PBN containers of the Examples were used, the grown epitaxial film had a reduced surface defect density, which means that reduction in the amount of material melt adhering to the upper portion of the container solves the problem that the material melt adhering to the upper portion drops and droplets of the material melt scatter.

In contrast, in a case where the PBN container of the Comparative Example 1 was used, the temperature of the upper portion of the PBN container become low, and adhesion of material melt to the upper portion of the container was remarkable. Therefore, the grown epitaxial film included many surface defects.

Example 4 Container in Which a Profile is Imparted to the Reflectivity

A graphite mandrel was disposed in a cylindrical graphite CVD furnace and was rotated. Boron trichloride and ammonium were supplied to the furnace at 2 l/min. and 5 l/min., respectively, and were allowed to react for 10 hours at a temperature of 1850° C. under a mean internal pressure of 2 Torr. Subsequently, $CH_4$ was mixed in the source gas at 5 L/min. and was allowed to react for 20 minutes to obtain a PBN container which was covered with a carbon-doped layer of 30 μm and which had a thickness of 1 mm, a diameter of 20 mm, and a height of 100 mm. Subsequently, the layer was removed by mechanical abrasion in an area extending over 65 mm from the bottom, so that the carbon-doped layer was left only in an area extending over 35 mm from the opening of the container.

The light reflectivity of the outermost surface of the container was measured at a first wave length of 2300 nm (λ max at 1000° C.), a second wave length of 2000 nm (λ max at 1200° C.), and a third wave length of 1700 nm (λ max at 1400° C.). The measured reflectivities at these wave lengths were 10%, 12%, and 8%, respectively.

Comparative Example 3

A graphite mandrel was disposed in a cylindrical graphite CVD furnace and was rotated. Boron trichloride and ammonium were supplied to the furnace at 2 l/min. and 5 l/min., respectively, and were allowed to react for 10 hours at a temperature of 1850° C. under a mean internal pressure of 2 Torr, thereby obtaining a PBN container having a thickness of 1 mm, a diameter of 20 mm, and a height of 100 mm.

The light reflectivity of the outer surface of the container was measured at the first wave length of 2300 nm (λ max at 1000° C.), the second wave length of 2000 nm (λ max at 1200° C.), and the third wave length of 1700 nm (λ max at 1400° C.). The measured reflectivities at these wave lengths were 60%, 55%, and 47%, respectively.

Comparative Example 4

The PBN container manufactured in Comparative Example 3 was again set in the CVD reaction chamber, and $CH_4$ was supplied to the furnace at 5 L/min. and was allowed to react for 3 hours (the means internal pressure of the furnace: 2 Torr; the internal temperature: 1650° C.) in order to deposit on the surface of the container a pyrolytic graphite (PG) coating layer having a thickness of 30 μm. Subsequently, the layer was removed by mechanical abrasion in an area extending over 65 mm from the bottom, so that the PG coating layer was left only in an area extending over 35 mm from the opening of the container.

The light reflectivity of the outer surface of the PG coating layer was measured at the first wave length of 2300 nm (λ max at 1000° C.), the second wave length of 2000 nm (λ max at 1200° C.), and the third wave length of 1700 nm (λ max at 1400° C. ). The measured reflectivities at these wave lengths were 60%, 60%, and 45%, respectively.

Subsequently, Al was placed in each of the PBN containers obtained in Example 4, and Comparative Examples 3 and 4 and was heated to 1100° C.; and GaAlAs epitaxial film was actually grown by the MBE method. The results are shown in Table 6.

TABLE 6

| Used PBN crucible | Power consumption (1100° C.) | Density of surface defects |
| --- | --- | --- |
| Example 4 | 88 W | 10/cm$^2$ |
| Comparative Example 3 | 100 W | 250/cm$^2$ |
| Comparative Example 4 | 98 W | 150/cm$^2$ |

As is apparent from Table 6, when the carbon-doped PBN container of Example 4 was used, the temperature gradation within the container become ideal. Therefore, drop of Al from the opening portion was occurred less, and epitaxial film having a reduced defect density was able to be grown in a stable manner.

By contrast, when the PBN containers of Comparative Examples 3 and 4 were used, drop of Al from the opening portion was occurred considerably, and the obtained epitaxial films had many defects as shown in Table 6. Also, since a larger portion of radiant light from the heater was reflected by the surface of the container, the power consumption of the heater was larger than that in the case where the PBN container of Example 4 was used.

The present invention is not limited to the above-described embodiment. The above-described embodiment is a mere example, and those having the substantially same structure as that described in the appended claims and providing the similar action and effects are included in the scope of the present invention.

The three methods were mentioned as methods of imparting a profile to the transmissivity of the container in the previous description, and they were individually explained. However, these methods may be carried out simultaneously. In this case, a finer transmissivity profile can be produced.

What is claimed is:

1. A pyrolytic boron nitride container for containing a material from which is generated molecular beams for molecular beam epitaxy, said container having a bottom protion, an opening portion and a height measured from said bottom portion to said opening portion; wherein the transmissivity of the pyrolytic boron nitride container with respect to light having a wave number of 2600 cm$^{-1}$ to 6500 cm$^{-1}$ has a profile such that the transmissivity changes either stepwise or gradually in the height direction of the container.

2. A pyrolytic boron nitride container according to claim 1, wherein the profile of the transmissivity is set such that the transmissivity decreases stepwise or gradually from the bottom portion to the opening portion of the container.

3. A pyrolytic boron nitride container according to claim 1, wherein the profile of the transmissivity is set such that the transmissivity increases stepwise or gradually from the bottom portion to the opening portion of the container.

4. A pyrolytic boron nitride container according to claim 1, wherein the absorptivity of pyrolytic boron nitride is changed in order to impart the profile to the transmissivity.

5. A pyrolytic boron nitride container according to claim 2, wherein the absorptivity of pyrolytic boron nitride is changed in order to impart the profile to the transmissivity.

6. A pyrolytic boron nitride container according to claim 1, wherein the roughness of the outer surface of the pyrolytic boron nitride container is changed in order to impart the profile to the transmissivity.

7. A pyrolytic boron nitride container according to claim 2, wherein the roughness of the outer surface of the pyrolytic boron nitride container is changed in order to impart the profile to the transmissivity.

8. A pyrolytic boron nitride container according to claim 1, wherein an element is doped into pyrolytic boron nitride to form a doped layer, while at least one of the thickness, area, and doping density of the doped layer is controlled, in order to impart the profile to the transmissivity.

9. A pyrolytic boron nitride container according to claim 2, wherein an element is doped into pyrolytic boron nitride to form a doped layer, while at least one of the thickness, area, and doping density of the doped layer is controlled, in order to impart the profile to the transmissivity.

10. A pyrolytic boron nitride container according to claim 8, wherein the doped layer is formed such that the layer is not exposed from the inner surface of the container.

11. A pyrolytic boron nitride container according to claim 10, wherein pyrolytic boron nitride is doped with one or more elements selected from B, N, Si, C, and Al.

12. A method of manufacturing a pyrolytic boron nitride container for containing a material from which is generated molecular beams for molecular beam epitaxy, comprising:

depositing pyrolytic boron nitride on a graphite mandrel by CVD in order to form a pyrolytic boron nitride container; and separating the pyrolytic boron nitride container from the mandrel, said container having a bottom portion, an opening portion and a height measured from said bottom portion to said opening portion;

wherein the absorptivity of the deposited pyrolytic boron nitride produced by CVD is controlled through placement of the mandrel according to the pressure profile in a CVD furnace, such that the transmissivity of the pyrolytic boron nitride container with respect to light having a wave number of 2600 cm$^{-1}$ to 6500 cm$^{-1}$ has a profile such that the transmissivity changes either stepwise or gradually in the height direction of the container.

13. A method of manufacturing a pyrolytic boron nitride container according to claim 12, further comprising imparting a predetermined profile to the roughness of the outer surface of the pyrolytic boron nitride container to thereby adjust the amount of light scattered at the surface of the container, such that a desired profile is imparted to the transmissivity of the container with respect to light having a wave number of 2600 cm$^{-1}$ to 6500 cm$^{-1}$.

14. A method of manufacturing a pyrolytic boron nitride container having a transmissivity profile for containing a material from which is generated molecular beams for molecular beam epitaxy, comprising:

depositing pyrolytic boron nitride on a graphite mandrel by a CVD reaction in order to form a pyrolytic boron nitride container; and separating the pyrolytic boron nitride container from the mandrel, said container having a bottom portion, an opening and a height measured from said bottom portion to said opening portion;

wherein a dopant gas is introduced into a furnace at least during the CVD reaction in order to form a doped layer in the pyrolytic boron nitride container, and at least one of the thickness, area and the doping density of the doped layer is adjusted in order to impart a profile to the transmissivity of the container with respect to light having a wave number of 2600 cm$^{-1}$ to 6500 cm$^{-1}$ such that the transmissivity changes either stepwise or gradually in the height direction of the container.

15. A pyrolytic boron nitride container for counting a material from which is generated molecular beams for molecular beam epitaxy, said container having a bottom portion, an opening portion and a height measured from said bottom portion to said opening portion; wherein the reflectivity of the outer surface of the pyrolytic boron nitride container with respect to light having a wave number of 2600 cm$^{-1}$ to 6500 cm$^{-1}$ has a profile such that the reflectivity changes either stepwise or gradually in the height direction of the container.

16. A pyrolytic boron nitride container according to claim 15, wherein the reflectivity of the container is made equal to or less than 25% in the entire outer surface or in a portion of the outer surface of the container.

17. A pyrolytic boron nitride container according to claim 15, wherein the profile of the reflectivity is set such that the reflectivity decreases stepwise or gradually from the bottom portion to the opening portion of the container.

18. A pyrolytic boron nitride container according to claim 15, wherein the profile of the reflectivity is set such that the reflectivity increases stepwise or gradually from the bottom portion to the opening portion of the container.

19. A pyrolytic boron nitride container according to claim 15, wherein an element is doped into pyrolytic boron nitride to form a doped layer, while at least one of the thickness, area, and doping density of the doped layer is controlled, in order to impart the profile to the reflectivity.

20. A method of manufacturing a pyrolytic boron nitride container having a reflectivity profile for containing a material from which is generated molecular beams for molecular beam epitax, comprising:

depositing pyrolytic boron nitride on a graphite mandrel by a CVD reaction in order to form a pyrolytic boron nitride container; and separating the pyrolytic boron nitride container from the mandrel, said container having a bottom portion, an opening portion and a height measured from said bottom portion to said opening portion;

wherein a dopant gas is introduced into a furnace at least during the CVD reaction in order to form a doped layer in the pyrolytic boron nitride container, and at least one of the thickness, area and the doping density of the doped layer is adjusted in order to impart a profile to the reflectivity of the outer surface of the container with respect to light having a wave number of 2600 cm$^{-1}$ to 6500 cm$^{-1}$ such that the reflectivity changes either stepwise or gradually in the height direction of the container.

* * * * *